US010595409B2

(12) United States Patent
Elsherbini et al.

(10) Patent No.: US 10,595,409 B2
(45) Date of Patent: *Mar. 17, 2020

(54) ELECTRO-MAGNETIC INTERFERENCE (EMI) SHIELDING TECHNIQUES AND CONFIGURATIONS

(71) Applicant: INTEL CORPORATION, Santa Clara, CA (US)

(72) Inventors: Adel A. Elsherbini, Chandler, AZ (US); Ravindranath Mahajan, Chandler, AZ (US); John S. Guzek, Chandler, AZ (US); Nitin A. Deshpande, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/628,430

(22) Filed: Jun. 20, 2017

(65) Prior Publication Data

US 2017/0290155 A1    Oct. 5, 2017

Related U.S. Application Data

(62) Division of application No. 14/184,575, filed on Feb. 19, 2014, now Pat. No. 9,713,255.

(51) Int. Cl.
*H01L 25/00* (2006.01)
*H05K 1/14* (2006.01)
(Continued)

(52) U.S. Cl.
CPC ............. *H05K 1/147* (2013.01); *H01L 23/13* (2013.01); *H01L 23/49833* (2013.01);
(Continued)

(58) Field of Classification Search
None
See application file for complete search history.

(56) References Cited

U.S. PATENT DOCUMENTS 8,064,224 B2    11/2011  Mahajan et al.
2004/0231872 A1*  11/2004  Arnold .................... H01L 23/04
                                                                174/377
(Continued)

OTHER PUBLICATIONS

Non-Final Office Action dated May 7, 2015 for U.S. Appl. No. 14/184,575, 13 pages.
(Continued)

*Primary Examiner* — Long Pham
(74) *Attorney, Agent, or Firm* — Schwabe, Williamson & Wyatt, P.C.

(57) ABSTRACT

Embodiments of the present disclosure are directed towards electro-magnetic interference (EMI) shielding techniques and configurations. In one embodiment, an apparatus includes a first substrate, a die having interconnect structures coupled with the first substrate to route input/output (I/O) signals between the die and the first substrate and a second substrate coupled with the first substrate, wherein the die is disposed between the first substrate and the second substrate and at least one of the first substrate and the second substrate include traces configured to provide electro-magnetic interference (EMI) shielding for the die. Other embodiments may be described and/or claimed.

8 Claims, 4 Drawing Sheets

(51) Int. Cl.
   *H01L 23/552*   (2006.01)
   *H01L 23/13*    (2006.01)
   *H01L 23/498*   (2006.01)
   *H05K 1/02*     (2006.01)
   *H01L 25/065*   (2006.01)
   *H05K 3/36*     (2006.01)

(52) U.S. Cl.
   CPC ............ *H01L 23/552* (2013.01); *H01L 25/50* (2013.01); *H05K 1/0218* (2013.01); *H01L 25/0655* (2013.01); *H01L 2224/13025* (2013.01); *H01L 2224/16225* (2013.01); *H01L 2224/2919* (2013.01); *H01L 2224/32225* (2013.01); *H01L 2224/48227* (2013.01); *H01L 2224/73253* (2013.01); *H01L 2924/15192* (2013.01); *H01L 2924/15311* (2013.01); *H01L 2924/3025* (2013.01); *H05K 3/361* (2013.01); *H05K 2201/09245* (2013.01); *H05K 2201/09681* (2013.01); *Y10T 29/49126* (2015.01)

(56) References Cited

U.S. PATENT DOCUMENTS

| | | | |
|---|---|---|---|
| 2010/0006987 A1* | 1/2010 | Murugan | H01L 23/552 257/659 |
| 2012/0015478 A1* | 1/2012 | Harper | H01L 23/3128 438/107 |
| 2014/0014813 A1* | 1/2014 | Mao | H01L 27/14623 250/208.1 |
| 2015/0171015 A1 | 6/2015 | Mahajan et al. | |

OTHER PUBLICATIONS

Final Office Action dated Nov. 16, 2015 for U.S. Appl. No. 14/184,575, 12 pages.
Non-Final Office Action dated May 25, 2016 for U.S. Appl. No. 14/184,575, 9 pages.
Final Office Action dated Nov. 18, 2016 for U.S. Appl. No. 14/184,575, 10 pages.
Notice of Allowance dated Mar. 15, 2017 for U.S. Appl. No. 14/184,575, 7 pages.

* cited by examiner

ELECTRO-MAGNETIC INTERFERENCE (EMI) SHIELDING TECHNIQUES AND CONFIGURATIONS

CROSS REFERENCE TO RELATED APPLICATION

This application is a divisional application of U.S. patent application Ser. No. 14/184,575, entitled "ELECTRO-MAGNETIC INTERFERENCE (EMI) SHIELDING TECHNIQUES AND CONFIGURATIONS", filed Feb. 19, 2014, and claims priority to the Ser. No. 14/184,575 application. The Specification of Ser. No. 14/184,575 is hereby fully incorporated by reference.

FIELD

Embodiments of the present disclosure generally relate to the field of integrated circuits, and more particularly, to electro-magnetic interference (EMI) shielding techniques and configurations.

BACKGROUND

Smaller and lighter electronic devices with greater functionality are being developed in response to demand by customers for mobile computing devices such as, for example, smartphones and tablets. Electromagnetic shielding may be used to reduce electro-magnetic interference (EMI) around a die (e.g., processor) of such electronic devices. Currently EMI shielding may be formed by gluing stamped metallic sheets or cages to a package assembly to shield the die or dies from EMI. However, current techniques may not be compatible with shrinking die package assembly dimensions to provide smaller form factor and/or z-height.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
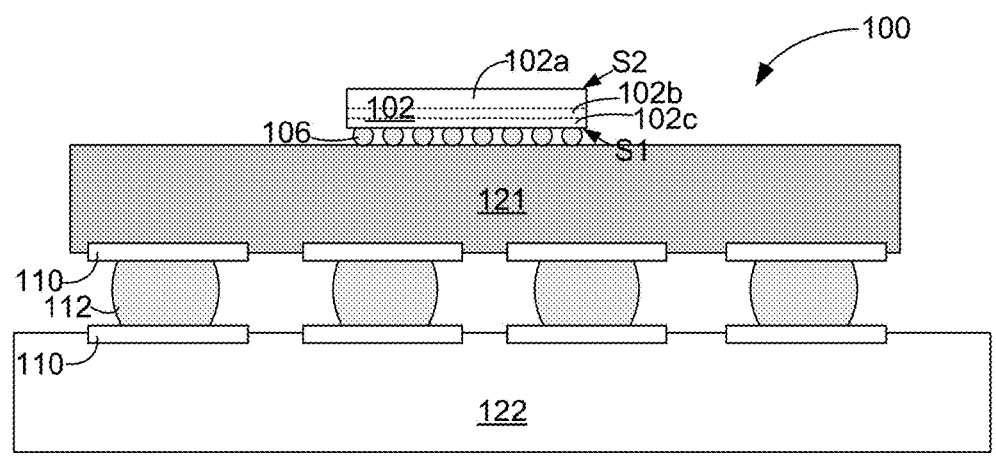
FIG. 1 schematically illustrates a cross-section side view of an example integrated circuit (IC) package assembly, in accordance with some embodiments.

Embodiments of the present disclosure describe electro-magnetic interference (EMI) shielding techniques and configurations. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group) and/or memory (shared, dedicated, or group) that execute one or more software or firmware programs, a combinational logic circuit, and/or other suitable components that provide the described functionality.

FIG. 1 schematically illustrates a cross-section side view of an example integrated circuit (IC) package assembly 100, in accordance with some embodiments. In some embodiments, the IC assembly 100 may include one or more dies (hereinafter "die 102") electrically and/or physically coupled with a package substrate 121. In some embodiments, the package substrate 121 may be electrically coupled with a circuit board 122, as can be seen.

The die 102 may represent a discrete product made from a semiconductor material (e.g., silicon) using semiconductor fabrication techniques such as thin film deposition, lithography, etching and the like used in connection with forming CMOS devices. In some embodiments, the die 102 may be, include, or be a part of a processor, memory, SoC or ASIC. In some embodiments, an electrically insulative material such as, for example, molding compound or underfill material (not shown) may encapsulate at least a portion of the die 102 and/or die-level interconnect structures 106.

The die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including active circuitry is attached to a surface of the package substrate 121 using die-level interconnect structures 106 such as bumps, pillars, or other suitable structures that may also electrically couple the die 102 with the package substrate 121. The active side S1 of the die 102 may include transistor devices and an inactive side, S2, may be disposed opposite to the active side S1, as can be seen.

The die 102 may generally include a semiconductor substrate 102a, one or more device layers (hereinafter "device layer 102b") and one or more interconnect layers (hereinafter "interconnect layer 102c"). The semiconductor substrate 102a may be substantially composed of a bulk semiconductor material such as, for example silicon, in some embodiments. The device layer 102b may represent a region where active devices such as transistor devices are formed on the semiconductor substrate 102a. The device layer 102b may include, for example, structures such as channel bodies and/or source/drain regions of transistor devices. The interconnect layer 102c may include interconnect structures that are configured to route electrical signals to or from the active devices in the device layer 102b. For example, the interconnect layer 102c may include trenches and/or vias to provide electrical routing and/or contacts.

In some embodiments, the die-level interconnect structures 106 may be configured to route electrical signals between the die 102 and other electrical devices. The electrical signals may include, for example, input/output (I/O) signals and/or power/ground signals that are used in connection with operation of the die 102.

In some embodiments, the package substrate 121 is an epoxy-based laminate substrate having a core and/or build-up layers such as, for example, an Ajinomoto Build-up Film (ABF) substrate. In other embodiments, the package substrate 121 may be a circuit board such as, for example, a printed circuit board (PCB) formed using any suitable PCB technique. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, pads or traces (not shown) disposed on one or more surfaces of the package substrate 121 and/or internal routing features (not shown) such as, for example, trenches, vias or other interconnect structures to route electrical signals through the package substrate 121. For example, in some embodiments, the package substrate 121 may include electrical routing features such as pads (not shown) configured to receive the respective die-level interconnect structures 106 of the die 102.

According to various embodiments, the package substrate 121 may include features (e.g., traces) configured to provide electro-magnetic interference (EMI) shielding for the die 102. For example, the package substrate 121 may comport with embodiments described in connection with first substrate 221 of FIG. 2 in some embodiments.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 802 of FIG. 8).

Package-level interconnects such as, for example, solder balls 112 may be coupled to one or more pads (hereinafter "pads 110") on the package substrate 121 and/or on the circuit board 122 to form corresponding solder joints that are configured to further route the electrical signals between the package substrate 121 and the circuit board 122. The pads 110 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the package substrate 121 with the circuit board 122 may be used in other embodiments.

The IC package assembly 100 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC package assembly 100 may be used in some embodiments.

Figure 2:
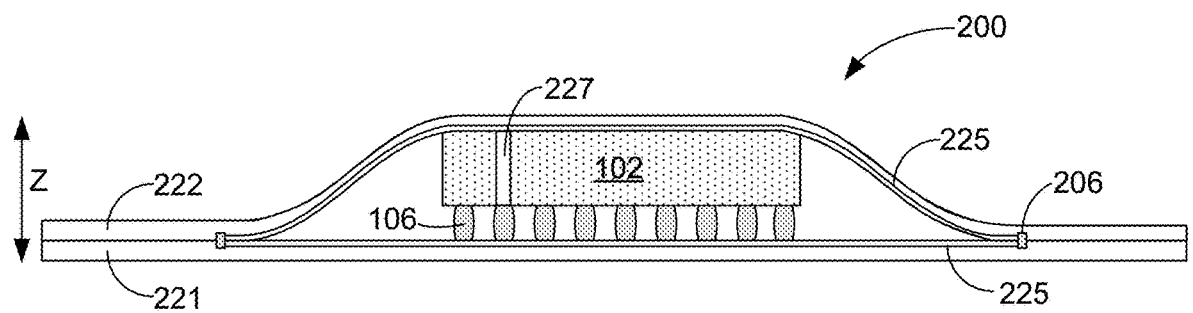
FIG. 2 schematically illustrates a cross-section side view of an electro-magnetic interference (EMI) shielding configuration for a die, in accordance with some embodiments.

FIG. 2 schematically illustrates a cross-section side view of an electro-magnetic interference (EMI) shielding configuration 200 for a die 102, in accordance with some embodiments. According to various embodiments, the EMI shielding configuration 200 includes a first substrate 221, a die 102 coupled with the first substrate 221, and a second substrate 222 coupled with the first substrate 221, as can be seen.

In some embodiments, the die 102 may be a processor or radio frequency (RF) die. The die 102 may include a wide variety of other suitable types of dies in other embodiments. The die 102 may have a thickness of 100 microns or thinner in some embodiments. The die 102 may have other suitable thickness ranges in other embodiments.

One or both of the first substrate 221 and the second substrate 222 may include features such as, for example, traces 225 configured to provide EMI shielding for the die 102. In one embodiment, the first substrate 221 includes traces 225 configured to provide EMI shielding for the die 102 and the second substrate 222 may not include such traces 225. In another embodiment, the first substrate 221 and the second substrate 222 each include traces 225 configured to provide EMI shielding for the die 102.

The first substrate 221 and/or the second substrate 222 may comport with embodiments described in connection with package substrate 121 of FIG. 1. For example, in some embodiments, the first substrate 221 and/or the second substrate 222 may be a PCB. According to various embodiments, the first substrate 221 and/or the second substrate 222 may be a single-layer or multi-layer substrate and may be rigid or flexible. In some embodiments, the second substrate 222 may be more flexible than the first substrate 221. In one embodiment, the first substrate 221 may be rigid and the second substrate 222 may be a flexible substrate configured to bend around the die 102, as can be seen in the depicted embodiment in FIG. 2.

Figure 3:
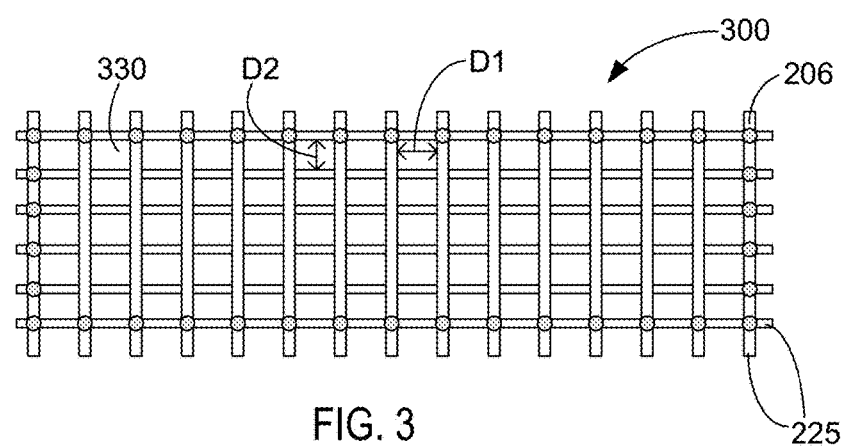
FIG. 3 schematically illustrates a top view of traces configured in a grid arrangement to provide EMI shielding for a die, in accordance with some embodiments.

The traces 225 formed in the first substrate 221 and/or second substrate 222 may be configured in a variety of suitable arrangements to provide EMI shielding for the die. FIG. 3 schematically illustrates a top view of traces configured in a grid arrangement 300 to provide EMI shielding for a die, in accordance with some embodiments. Referring to FIGS. 2 and 3, the traces 225 may include a first plurality of traces that extend in a first direction and a second plurality of other traces that extend in a second direction that is substantially perpendicular to the first direction, as can be seen.

A distance (e.g., D1 and/or D2) between adjacent traces 225 may be configured to provide openings (e.g., opening 330) in the grid arrangement 300 that allow, facilitate or provide shielding against a pre-determined wavelength of EMI. For example, the distance may be selected to provide a largest dimension across the opening that is less than a pre-determined wavelength of EMI. In some embodiments, the distance between adjacent traces 225 may be smaller than a pre-determined wavelength of EMI. In other embodiments, the distance between adjacent traces 225 may be configured to provide an opening 330 dimension that is less than a minimum or smallest wavelength of EMI. To increase likelihood or effectiveness of shielding, the distance between adjacent traces 225 may be configured to provide an opening 330 dimension that is less than a minimum or smallest wavelength of EMI that is divided by a factor such as, for example, 5 or 10.

According to various embodiments, the EMI shielding configuration 200 may include one or more interconnect structures 206 that electrically couple traces 225 of the first substrate 221 with traces 225 of the second substrate 222. The interconnect structures 206 may include a wide variety of suitable electrically conductive structures such as, for example, solder, vias (e.g., through-holes), pads, anisotropic conductive paste and the like. The traces 225 may be coupled with a power or ground supply in some embodiments. For example, in some embodiments, the traces 225 of the first substrate 221 may be coupled with a power or ground supply and the traces 225 of the second substrate 222 may be electrically coupled with the traces 225 of the first substrate 221 to form a Faraday cage around the die 102.

The traces 225 may be formed using any suitable technique, including deposition and/or patterning of a metal such as copper (Cu) using, for example, PCB fabrication processes. Although some of the traces 225 are shown as overlapping other traces 225 in the depicted embodiment of FIG. 3, the traces 225 may be simultaneously formed or deposited and may be disposed within a same plane in other embodiments.

Referring again to FIG. 2, the die 102 may include one or more through silicon connections (TSCs) such as, for example, one or more through-silicon vias (TSVs) 227. In some embodiments, the one or more TSVs 227 may be configured to route power or ground between a respective power or ground supply and transistor circuitry (e.g., active side) of the die 102. For example, the one or more TSVs 227 may be electrically coupled with the power or ground supply through traces 225 in the second substrate 222. In other embodiments, the one or more TSVs 227 may be configured to route I/O signals between the die 102 and the second substrate 222.

The die 102 may be coupled with the first substrate 221 and/or the second substrate 222 according to a wide variety of suitable configurations. For example, in the depicted configuration, the die 102 is coupled with the first substrate 221 in a flip-chip configuration using interconnect structures 106 that are first-level interconnect (FLI) structures, which directly attach an active side of the die 102 to corresponding electrical connections on the first substrate 221. An inactive side of the die 102 may be coupled with the second substrate 222 using an adhesive.

The die 102 may be coupled with the first substrate 221 and/or the second substrate 222 using other configurations in other embodiments. In some embodiments, the die 102 may be part of a die package assembly where the die 102 is coupled with other components such as, for example, a package substrate (e.g., package substrate 121 of FIG. 1), another interposer, a mold compound or other like component prior to coupling the die package assembly with the first substrate 221 and/or the second substrate 222. The die package assembly may be disposed between the first substrate 221 and the second substrate 222. For example, if the die 102 is coupled with a package substrate, the package substrate may be coupled with the first substrate 221 using second-level interconnects (SLI) and electrical signals of the die 102 may be routed between the die 102 and the first substrate 221 through the package substrate.

Configurations for EMI shielding described herein may allow reduction of a Z-height (e.g., direction of arrow Z in FIG. 2) and/or form factor of an IC package assembly having an EMI shielding configuration 200 relative to other conventional EMI shielding configurations. For example, PCB fabrication may be used to fabricate EMI shielding such as a net (e.g., grid arrangement 300 of FIG. 3) that is substantially smaller than conventional EMI shielding such as, for example, EMI shielding formed by gluing metallic sheets to protect a die.

Additionally, in some embodiments, the EMI shielding configuration 200 may allow additional functionality to be integrated into an IC package assembly having the EMI shielding configuration 200. For example, in some embodiments, the second substrate 222 may include or be a solar panel, a flexible display, or functional feature of a mobile computing device, or may provide additional routing for the die 102.

Figure 4:
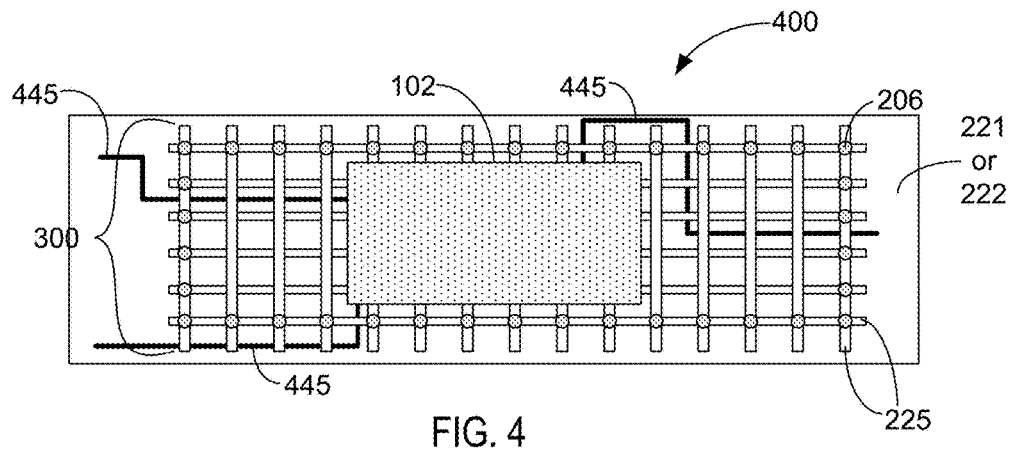
FIG. 4 schematically illustrates a top/bottom view of an EMI shielding configuration for a die, in accordance with some embodiments.

FIG. 4 schematically illustrates a top/bottom view of an EMI shielding configuration 400 for a die 102, in accordance with some embodiments. The EMI shielding configuration 400 may represent a top view of the first substrate 221 where the second substrate 222 is not shown or, in other embodiments, the EMI shielding configuration 400 may represent a bottom view of the second substrate 222 where the first substrate 221 is not shown. Although traces 225 are depicted, in some embodiments, the traces 225 may underlie a surface of the first substrate 221 or second substrate 222. In some embodiments, the EMI shielding configuration 400 may further include routing features 445 configured to route I/O signals of the die 102.

Referring to FIGS. 2 and 4, in embodiments where the first substrate 221 and/or the second substrate 222 is a multi-layer substrate, the traces 225 may, for example, be formed in an outermost conductive layer (e.g., a first layer) of the first substrate 221 and/or the second substrate 222 that is positioned adjacent to the die 102. The routing features 445 for I/O signals may be disposed in other conductive layers of the first substrate 221 and/or the second substrate 222. For example, the routing features 445 may be routed to other conductive layers of the first substrate 221 and/or second substrate 222 through openings (e.g., opening 330) between traces 225 or a portion of some traces 225 may be removed to facilitate or allow routing of I/O signals through the traces 225, or combinations of these techniques. The routing features 445 may be disposed in a same or different plane as the traces 225 in some embodiments. In some embodiments, the routing features 445 may be configured to route low frequency direct current (DC).

Figure 5:
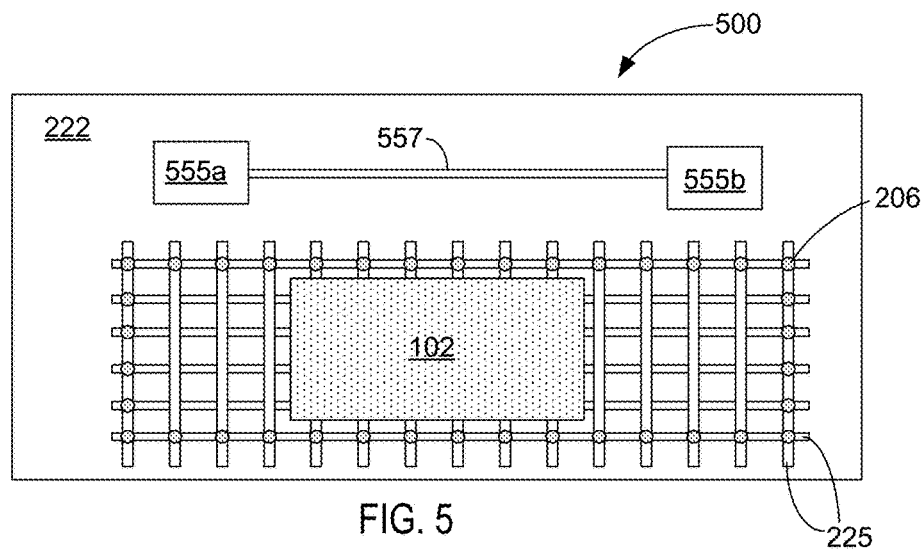
FIG. 5 schematically illustrates a bottom view of another EMI shielding configuration for a die, in accordance with some embodiments.

FIG. 5 schematically illustrates a bottom view of another EMI shielding configuration 500 for a die 102, in accordance with some embodiments. In some embodiments, the EMI shielding configuration 500 represents a bottom view of the second substrate 222 where the second substrate 222 is a single layer substrate. Additional components 555a, 555b may be electrically coupled with the second substrate 222. The additional components 555a, 555b may include, for example, discrete passive components such as resistors, capacitors, inductors, and the like. or components of an RF/radio system such as media access control (MAC) device, power amplifier, filter, and the like. The additional components 555a, 555b may represent other suitable devices in other embodiments. Routing 557 such as one or more traces may be formed to electrically couple the additional components 555a, 555b together or with other electrical features of an IC package assembly. In some embodiments, the routing 557 may be configured to route low frequency direct current (DC) (e.g., 3-5 V). More or fewer additional components 555a, 555b may be disposed on the second substrate 222 in other embodiments.

Figure 6:
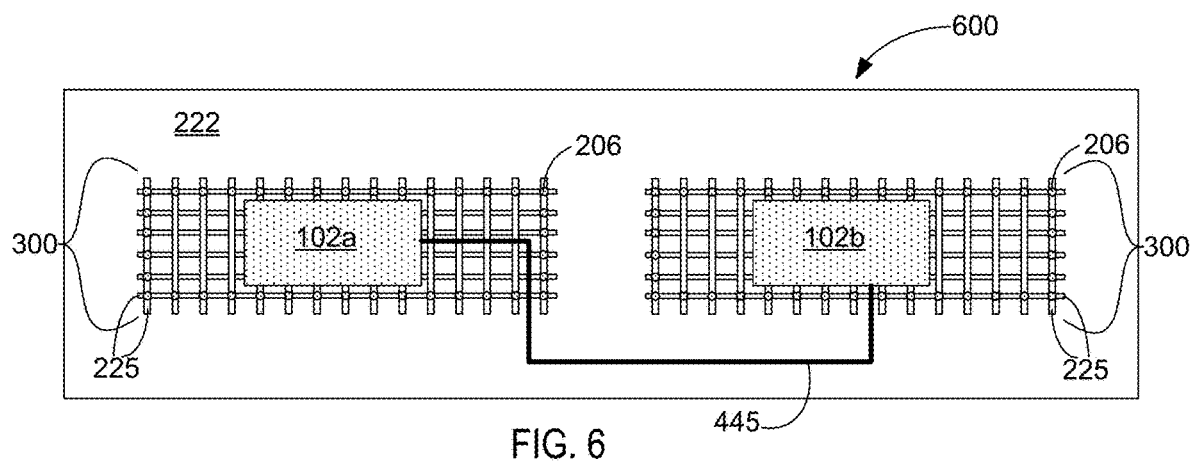
FIG. 6 schematically illustrates a bottom view of an EMI shielding configuration for multiple dies, in accordance with some embodiments.

FIG. 6 schematically illustrates a bottom view of an EMI shielding configuration 600 for multiple dies 102a, 102b, in accordance with some embodiments. The dies 102a, 102b may comport with embodiments described in connection with die 102.

In some embodiments, the EMI shielding configuration 600 represents a bottom view of the second substrate 222 where the second substrate 222 is a single layer substrate. Multiple dies 102a, 102b may be coupled with the second substrate 222. The second substrate 222 may include traces 225 forming respective grid arrangements 300 to provide EMI shielding for each of the multiple dies 102a, 102b. In some embodiments, the dies 102a, 102b may be electrically coupled together using routing features 445. A portion of some traces 225 may be removed to facilitate or allow routing of I/O signals through the traces 225 using routing features 445. In some embodiments, the routing features 445 may be configured to route low frequency direct current (DC).

More or fewer dies than depicted may be coupled with the first substrate 221 and/or second substrate 222 in other embodiments. According to various embodiments, techniques and configurations described in connection with FIGS. 1-6 may be suitably combined.

Figure 7:
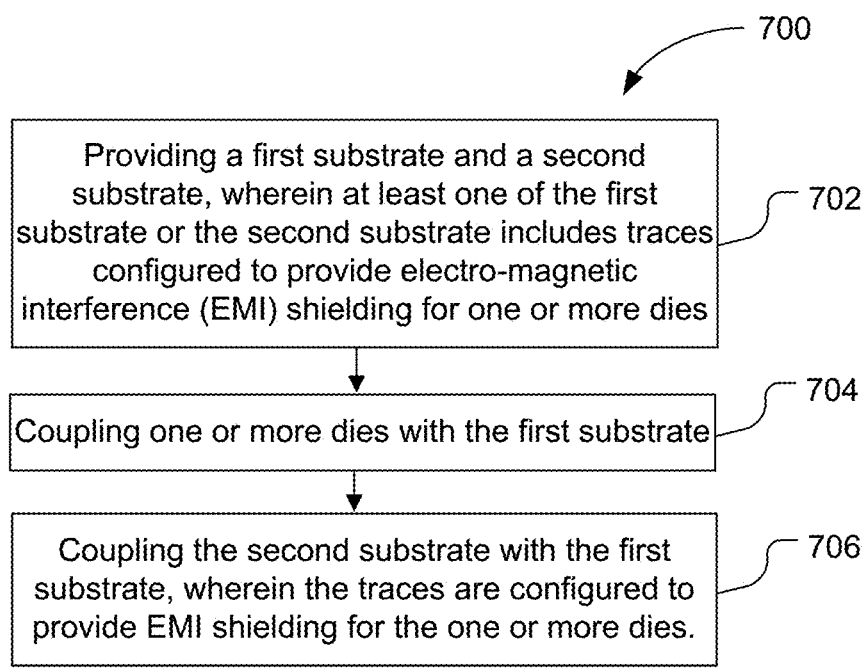
FIG. 7 schematically illustrates a flow diagram for a method of fabricating EMI shielding for one or more dies, in accordance with some embodiments.

FIG. 7 schematically illustrates a flow diagram for a method 700 of fabricating EMI shielding for one or more dies (e.g., die 102 of FIGS. 1-5 or dies 102a, 102b of FIG. 6), in accordance with some embodiments. The techniques of method 700 may comport with techniques described in connection with FIGS. 1-6 and vice versa, according to various embodiments.

At 702, the method 700 may include providing a first substrate (e.g., first substrate 221 of FIG. 2) and a second substrate (e.g., second substrate 222 of FIG. 2), wherein at least one of the first substrate or the second substrate includes traces (e.g., traces 225 of FIG. 2) configured to provide electro-magnetic interference (EMI) shielding for one or more dies. In some embodiments, providing the first substrate may include forming the first substrate (e.g., forming a PCB) and providing the second substrate may include forming the second substrate (e.g., a PCB).

In some embodiments, providing the first substrate comprises providing a rigid substrate and providing the second substrate comprises providing a flexible substrate. In some embodiments, the flexible substrate may be formed to account for warpage of the flexible substrate over the die, for example, by predistorting a metal layer mask used to form features (e.g., finer features) of the flexible substrate such as traces and/or interconnect structures or by using loose tolerances in design rules to provide larger features (e.g., larger via pads, wider line-to-line spacing between routing lines such as traces or other routing features).

At 704, the method 700 may include coupling one or more dies with the first substrate. In some embodiments, the one or more dies may be coupled with the first substrate using interconnect structures to route I/O signals between the die and the first substrate. For example, coupling the one or more dies may include forming FLIs that directly attach the one or more dies to with the first substrate.

In some embodiments, the die may be disposed in a die package assembly. For example, the die may be coupled with one or more of the features described in connection with the IC package assembly 100 of FIG. 1. In some embodiments, coupling the die with the substrate may include forming SLIs to attach the die package assembly with the first substrate.

At 706, the method 700 may include coupling the second substrate with the first substrate, wherein the traces are configured to provide EMI shielding for the one or more dies. The second substrate may be coupled with the first substrate using interconnect structures (e.g., interconnect structures 206) such as package-level interconnects (e.g., SLIs) as described herein. Subsequent to coupling the second substrate with the first substrate, the die may be disposed or embedded between the first substrate and the second substrate. In embodiments, the second substrate may be a flexible substrate configured to bend around the die and coupling the second substrate with the first substrate may include bending the second substrate around the die.

Various operations are described as multiple discrete operations in turn, in a manner that is most helpful in understanding the claimed subject matter. However, the order of description should not be construed as to imply that these operations are necessarily order dependent. For example, actions of the method 700 may be performed in another suitable order than depicted.

Figure 8:
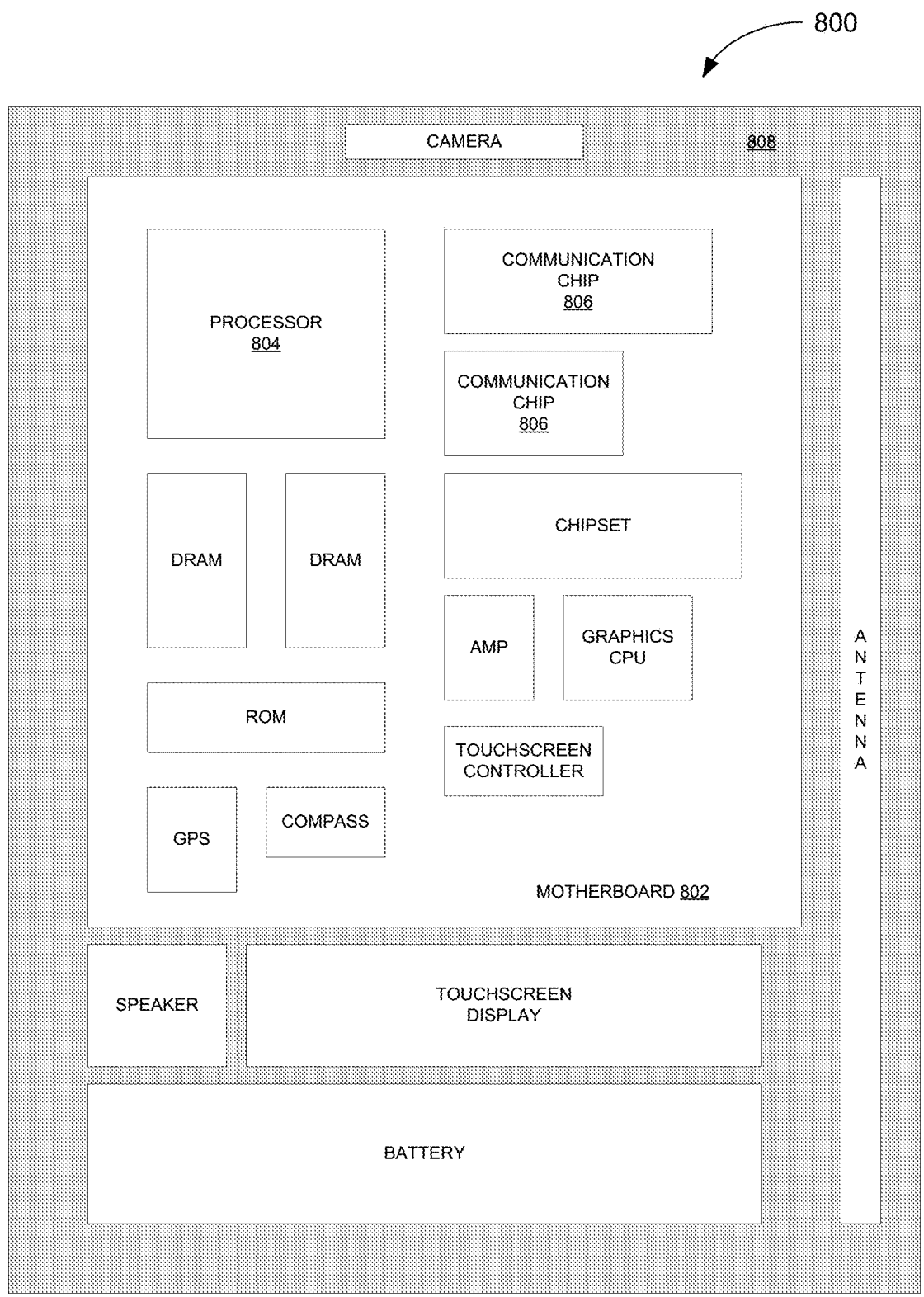
FIG. 8 schematically illustrates a computing device that includes EMI shielding as described herein, in accordance with some embodiments.

Embodiments of the present disclosure may be implemented into a system using any suitable hardware and/or software to configure as desired. FIG. 8 schematically illustrates a computing device 800 that includes EMI shielding (e.g., EMI shielding configuration 200 of FIG. 2) as described herein, in accordance with some embodiments. The computing device 800 may house a board such as motherboard 802 (e.g., in housing enclosure 808). The motherboard 802 may include a number of components, including but not limited to a processor 804 and at least one communication chip 806. The processor 804 may be physically and electrically coupled to the motherboard 802. In some implementations, the at least one communication chip 806 may also be physically and electrically coupled to the motherboard 802. In further implementations, the communication chip 806 may be part of the processor 804.

Depending on its applications, computing device 800 may include other components that may or may not be physically and electrically coupled to the motherboard 802. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, solar panel, flexible display and a mass storage device (such as hard disk drive, compact disk (CD), digital versatile disk (DVD), and so forth).

The communication chip 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16—2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 806 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 may be packaged in an IC package assembly (e.g., package assembly 100 of FIG. 1) and/or EMI shielding configuration (e.g., EMI shielding configuration 200 of FIG. 2) as described herein. For example, the circuit board 122 of FIG. 1 may be a motherboard 802 and the processor 804 may be a die 102 mounted on a package substrate 121 of FIG. 1. The package substrate 104 and the motherboard 802 may be coupled together using package-level interconnect structures (e.g., solder balls 112 of FIG. 1). The term "processor" may refer to any device or portion of a device that processes electronic data from registers and/or memory to transform that electronic data into other electronic data that may be stored in registers and/or memory.

The communication chip 806 may also include a die that may be packaged in an IC package assembly (e.g., package assembly 100 of FIG. 1) and/or EMI shielding configuration (e.g., EMI shielding configuration 200 of FIG. 2) as described herein. In further implementations, another component (e.g., memory device or other integrated circuit device) housed within the computing device 800 may include a die that may be packaged in an IC package assembly (e.g., package assembly 100 of FIG. 1) and/or EMI shielding configuration (e.g., EMI shielding configuration 200 of FIG. 2) as described herein.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. The computing device 800 may be a mobile computing device in some embodiments. In further implementations, the computing device 800 may be any other electronic device that processes data.

EXAMPLES

According to various embodiments, the present disclosure describes an apparatus. Example 1 of an apparatus may include a first substrate, a die having interconnect structures coupled with the first substrate to route input/output (I/O) signals between the die and the first substrate and a second substrate coupled with the first substrate, wherein the die is disposed between the first substrate and the second substrate and at least one of the first substrate and the second substrate include traces configured to provide electro-magnetic interference (EMI) shielding for the die. Example 2 may include the apparatus of Example 1, wherein the first substrate is a printed circuit board and the second substrate is a printed circuit board. Example 3 may include the apparatus of Example 1, wherein the first substrate is rigid and the second substrate is a flexible substrate configured to bend around the die. Example 4 may include the apparatus of Example 1, wherein the traces are configured in a grid arrangement; and a distance between adjacent traces is smaller than a predetermined wavelength of the EMI. Example 5 may include the apparatus of Example 1, wherein the first substrate includes traces configured to provide EMI shielding for the die. Example 6 may include the apparatus of Example 5, wherein the second substrate includes traces configured to provide EMI shielding for the die. Example 7 may include the apparatus of Example 6, wherein the traces of the first substrate are coupled with power or ground supply and the traces of the first substrate are electrically coupled with the traces of the second substrate to form a Faraday cage around the die. Example 8 may include the apparatus of Example 7, wherein the die includes one or more through-silicon vias (TSVs) configured to route power or ground between the respective power or ground supply and transistor circuitry of the die. Example 9 may include the apparatus of any of Examples 1-8, wherein the interconnect structures are first-level interconnect structures that directly attach the die to the first substrate. Example 10 may include the apparatus of any of Examples 1-8, wherein the die is disposed in a die package assembly and the die package assembly is disposed between the first substrate and the second substrate. Example 11 may include the apparatus of any of Examples 1-8, wherein the die is one of a plurality of dies coupled with the first substrate and wherein the traces are configured to provide EMI shielding for the plurality of dies.

According to various embodiments, the present disclosure may describe a method. Example 12 may include a method comprising providing a first substrate, coupling a die with the first substrate using interconnect structures to route input/output (I/O) signals between the die and the first substrate and coupling a second substrate with the first substrate such that the die is disposed between the first substrate and the second substrate, wherein at least one of the first substrate and the second substrate include traces configured to provide electro-magnetic interference (EMI) shielding for the die. Example 13 may include the method of Example 12, wherein providing the first substrate comprises forming a printed circuit board and the second substrate is a printed circuit board. Example 14 may include the method of Example 12, wherein the second substrate is a flexible substrate configured to bend around the die and coupling the second substrate with the first substrate comprises bending the second substrate around the die and forming package-level interconnects between the second substrate and the first substrate. Example 15 may include the method of Example 12, further comprising forming the second substrate. Example 16 may include the method of Example 12, wherein the traces are configured in a grid arrangement and a distance between adjacent traces is smaller than a predetermined wavelength of the EMI. Example 17 may include the method of any of Examples 12-16, wherein coupling the die with the first substrate comprises forming first-level interconnect structures that directly attach the die to the first substrate. Example 18 may include the method of any of Examples 12-16, wherein the die is disposed in a die package assembly and coupling the die with the substrate comprises forming second-level interconnect structures that attach the die package assembly to the first substrate. Example 19 may include the method of any of Examples 12-16, wherein the die is one of a plurality of dies, the method further comprising coupling the plurality of dies with the first substrate, wherein the traces are configured to provide EMI shielding for the plurality of dies.

According to various embodiments, the present disclosure may describe a system (e.g., a computing device). Example 20 may include a computing device comprising a housing enclosure, a package assembly disposed within the housing enclosure, the package assembly including a first substrate, a die having interconnect structures coupled with the first substrate to route input/output (I/O) signals between the die and the first substrate and a second substrate coupled with the first substrate, wherein the die is disposed between the first substrate and the second substrate and at least one of the first substrate and the second substrate include traces configured to provide electro-magnetic interference (EMI) shielding for the die. Example 21 may include the computing device of Example 20, wherein the computing device is a mobile computing device including one or more of an antenna, a flexible display, a solar panel, a touchscreen controller, a battery, an audio codec, a video codec, a power amplifier, a global positioning system (GPS) device, a compass, a Geiger counter, an accelerometer, a gyroscope, a speaker, or a camera.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A method comprising:
providing a first substrate;
coupling a die with the first substrate using interconnect structures to route input/output (I/O) signals between the die and the first substrate; and
coupling a second substrate with the first substrate such that the die is disposed between the first substrate and the second substrate, wherein the first substrate and the second substrate include traces that are to provide electro-magnetic interference (EMI) shielding for the die from the EMI generated by components other than the die, wherein the traces of the first substrate and the traces of the second substrate are electrically coupled to form a Faraday cage around the die.

2. The method of claim 1, wherein:

providing the first substrate comprises forming a printed circuit board; and the second substrate is a printed circuit board.

3. The method of claim 1, wherein:

the second substrate is a flexible substrate provided to bend around the die; and coupling the second substrate with the first substrate comprises bending the second substrate around the die and forming package-level interconnects between the second substrate and the first substrate.

4. The method of claim 1, further comprising:

forming the second substrate, including predistorting a metal layer mask used to form the traces in the second substrate, to account for warpage of the second substrate over the die.

5. The method of claim 1, wherein:

the traces are provided in a grid arrangement; and a distance between adjacent traces is smaller than a pre-determined wavelength of the EMI.

6. The method claim 1, wherein coupling the die with the first substrate comprises forming first-level interconnect structures that directly attach the die to the first substrate.

7. The method of claim 1, wherein:

the die is disposed in a die package assembly; and coupling the die with the substrate comprises forming second-level interconnect structures that attach the die package assembly to the first substrate.

8. The method of claim 1, wherein the die is one of a plurality of dies, the method further comprising:

coupling the plurality of dies with the first substrate, wherein the traces are to provide EMI shielding for the plurality of dies.

* * * * *